US010069499B2

(12) United States Patent
Takamuku et al.

(10) Patent No.: US 10,069,499 B2
(45) Date of Patent: Sep. 4, 2018

(54) METHOD OF MANUFACTURING OSCILLATOR, OSCILLATOR, ELECTRONIC APPARATUS, AND MOVING OBJECT

(71) Applicant: Seiko Epson Corporation, Tokyo (JP)

(72) Inventors: Makoto Takamuku, Chino (JP); Takuya Owaki, Minowa (JP); Takeshi Kobayashi, Chino (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 15/073,798

(22) Filed: Mar. 18, 2016

(65) Prior Publication Data

US 2016/0285462 A1 Sep. 29, 2016

(30) Foreign Application Priority Data

Mar. 27, 2015 (JP) ................................. 2015-067357

(51) Int. Cl.
| H03B 5/32 | (2006.01) |
| H03L 1/04 | (2006.01) |
| H03B 5/36 | (2006.01) |
| H03L 1/02 | (2006.01) |

(52) U.S. Cl.
CPC ................ H03L 1/04 (2013.01); H03B 5/36 (2013.01); H03L 1/022 (2013.01); H03L 1/028 (2013.01)

(58) Field of Classification Search
CPC ......... H03L 7/0891; H03L 1/026; H03L 1/04; H03L 1/022; H03L 1/028; H03B 5/36
USPC .................................... 331/176, 158, 116 FE
See application file for complete search history.

(56) References Cited

U.S. PATENT DOCUMENTS

| 8,314,662 B2* | 11/2012 | Isohata | ................... H03L 1/027 |
| | | | 331/154 |
| 2013/0106522 A1 | 5/2013 | Kobayashi | |
| 2014/0152392 A1 | 6/2014 | Owaki et al. | |

FOREIGN PATENT DOCUMENTS

| JP | 2003-004785 A | 1/2003 |
| JP | 2004-336374 A | 11/2004 |
| JP | 2008-113383 A | 5/2008 |
| JP | 2008-141347 A | 6/2008 |
| JP | 2010-103802 A | 5/2010 |

(Continued)

Primary Examiner — Arnold Kinkead
(74) Attorney, Agent, or Firm — Harness, Dickey & Pierce, P.L.C.

(57) ABSTRACT

The present disclosure is directed to a method of manufacturing an oscillator. The oscillator includes a resonator element, an oscillation circuit which outputs an oscillation signal by oscillating the resonator element, and a temperature compensation circuit which compensates for temperature characteristics of a frequency of the oscillation signal in a desired temperature range. The method includes a first temperature compensation adjustment step in which the frequency is measured at multiple temperatures, and first temperature compensation data is calculated based on a relationship between temperature and the frequency. The method also includes performing a second temperature compensation adjustment step in which, after the first temperature compensation adjustment step, the frequency that is obtained by performing temperature compensation by the temperature compensation circuit based on the first temperature compensation data is measured at multiple temperatures, and second temperature compensation data is calculated based on a relationship between temperature and the frequency.

16 Claims, 9 Drawing Sheets

(56) References Cited

FOREIGN PATENT DOCUMENTS

| | | | |
|---|---|---|---|
| JP | 2010-213102 | A | 9/2010 |
| JP | 2011-091691 | A | 5/2011 |
| JP | 2013-098865 | A | 5/2013 |
| JP | 2014-107862 | A | 6/2014 |

\* cited by examiner

METHOD OF MANUFACTURING OSCILLATOR, OSCILLATOR, ELECTRONIC APPARATUS, AND MOVING OBJECT

BACKGROUND

1. Technical Field

The present invention relates to a method of manufacturing oscillator, an oscillator, an electronic apparatus, and a moving object.

2. Related Art

A temperature compensated crystal oscillator (TCXO) includes a crystal resonator and an integrated circuit (IC) for oscillating the crystal resonator, and can obtain high frequency accuracy, as the IC compensates (temperature-compensates) for deviation (frequency deviation) of a desired frequency (nominal frequency) of an oscillation frequency of a crystal resonator in a predetermined temperature range. The TCXO is disclosed in, for example, JP-A-2014-107862 or JP-A-2010-103802.

An AT cut resonator is used as the TCXO. Since frequency temperature characteristics of the AT cut resonator exhibit a third order curved line, the AT cut resonator has an advantage in which a stable frequency is obtained in a wide temperature range, compared to other cut resonators.

In general, a frequency of an oscillator is measured at multiple temperatures in a temperature compensation adjustment step, and temperature compensation data is generated to reduce frequency deviation at a reference temperature (for example, 25° C.), based on the measured frequency. For this reason, for example, in a case in which a temperature compensation range is set to −40° C. to +85° C., the difference between −40° C. and +85° C. which are temperatures (temperatures of ends of the temperature compensation range) of the boundary between the temperature compensation range and the outside of the range and the reference temperature is the largest, and thus, a frequency easily and rapidly changes at least one of −40° C. and +85° C. In doing so, even with a slight temperature change in the vicinity of the temperature, the frequency of a temperature compensated oscillator changes greatly, and thus, there is a problem that frequency stability decreases.

SUMMARY

An advantage of some aspects of the invention is to provide a method of manufacturing an oscillator by which frequency stability of the temperature compensated oscillator can increase more than that of the related art, a temperature compensated oscillator which can increase frequency stability higher than that of the related art, and an electronic apparatus and a moving object which use the oscillator.

The invention can be implemented as the following forms or application examples.

APPLICATION EXAMPLE 1

A method of manufacturing an oscillator according to this application example is a method of manufacturing an oscillator that includes a resonator element, an oscillation circuit which outputs an oscillation signal by oscillating the resonator element, a temperature compensation circuit which compensates for temperature characteristics of a frequency of the oscillation signal in a desired temperature range. The method includes a first temperature compensation adjustment step in which the frequency is measured at multiple temperatures, and first temperature compensation data is calculated based on a relationship between temperature and the frequency; and a second temperature compensation adjustment step in which, after the first temperature compensation adjustment step, the frequency that is obtained by performing temperature compensation by the temperature compensation circuit based on the first temperature compensation data is measured at multiple temperatures, and second temperature compensation data is calculated based on a relationship between temperature and the frequency.

Various oscillation circuits such as, a Pierce oscillation circuit, an inverter type oscillation circuit, a Colpitts oscillation circuit, or a Hartley oscillation circuit may be configured by a resonator element and an oscillation circuit.

In the method of manufacturing an oscillator according to this application example, even in a case in which the frequency for which temperature compensation is performed based on the first temperature compensation data rapidly changes at a temperature of an end of the desired temperature range, for example, at a temperature of an end of the temperature compensation range, a frequency for which temperature compensation is performed based on the first temperature compensation data is added, and thereby the second temperature compensation data, which makes a frequency change at a temperature of the end of the temperature compensation range gentler, can be generated. Hence, according to the method of manufacturing the oscillator of the application example, it is possible to increase frequency stability of the temperature compensated oscillator more than that of the related art.

APPLICATION EXAMPLE 2

In the oscillator according to the application example, in the second temperature compensation adjustment step, the second temperature compensation data may be calculated in which a slope of frequency deviation with respect to temperature of the oscillation signal that is compensated for by the temperature compensation circuit is larger than or equal to −20 ppb/° C. and smaller than or equal to +20 ppb/° C. at a temperature of an end of the desired temperature range.

According to the method of manufacturing an oscillator of this application example, a slope of frequency deviation at a temperature of an end of a desired temperature range, for example, at a temperature of an end of a temperature compensation range is smaller than that of the related art, and thus, it is possible to provide a temperature compensated oscillator in which frequency stability is higher than that of the related art.

APPLICATION EXAMPLE 3

In the oscillator according to the application example, in the second temperature compensation adjustment step, the second temperature compensation data may be calculated in which the slope of the frequency deviation at a temperature of the end is larger than or equal to −10 ppb/° C. and smaller than or equal to +10 ppb/° C.

According to the method of manufacturing an oscillator of this application example, a slope of frequency deviation at a temperature of an end of a desired temperature range, for example, at a temperature of an end of a temperature compensation range further decreases, and thus, it is possible to provide a temperature compensated oscillator in which frequency stability further increases.

APPLICATION EXAMPLE 4

In the method of manufacturing an oscillator according to the application example, in the desired temperature range, the maximum value of a slope of frequency deviation with respect to temperature of the oscillation signal in a case in which temperature compensation is performed based on the second temperature compensation data may be smaller than the maximum value of a slope of the frequency deviation in a case in which temperature compensation is performed based on the first temperature compensation data.

According to the method of manufacturing an oscillator of this application example, it is possible to provide a temperature compensated oscillator having increased frequency stability at each temperature of a desired temperature range, for example, at each temperature of a temperature compensation range.

APPLICATION EXAMPLE 5

An oscillator according to this application example includes a resonator element; an integrated circuit that includes an oscillation circuit which outputs an oscillation signal by oscillating the resonator element, a temperature compensation circuit which compensates for temperature characteristics of a frequency of the oscillation signal in a desired temperature range, and a first surface on which a terminal that is electrically connected to the resonator element is disposed; a first container which contains the resonator element and includes a first lid of a metal which covers the resonator element; and a second container which contains the first container and the integrated circuit, in which the first container is disposed such that a surface on a side opposite to the first lid side faces an inner surface of the second container, in which the integrated circuit has a surface on a side opposite to the first surface bonded to the first lid through an adhesive member, and in which a slope of frequency deviation with respect to temperature of the oscillation signal which is compensated for by the temperature compensation circuit is larger than or equal to −20 ppb/° C. and smaller than or equal to +20 ppb/° C. at a temperature of an end of the desired temperature range.

Various oscillation circuits such as, a Pierce oscillation circuit, an inverter type oscillation circuit, a Colpitts oscillation circuit, or a Hartley oscillation circuit may be configured by a resonator element and an oscillation circuit.

According to the oscillator of this application example, the integrated circuit including the oscillation circuit and the temperature compensation circuit is bonded to the first lid of a metal of the first container which contains the resonator element through the adhesive member. By doing so, in the oscillator according to the present embodiment, the heat of the integrated circuit is conducted to the resonator element at a short time, and thus, a temperature difference between the integrated circuit and the resonator element decreases, an error of temperature compensation performed by the temperature compensation circuit is reduced, and frequency stability can increase. Hence, according to the oscillator of the present embodiment, a slope of frequency deviation at a temperature of an end of a desired temperature range, for example, at a temperature of an end of a temperature compensation range is smaller than that of the related art, and thus, it is possible to provide an oscillator in which frequency stability is higher than that of the related art.

APPLICATION EXAMPLE 6

In the oscillator according to the application example, the slope of the frequency deviation at a temperature of the end may be larger than or equal to −10 ppb/° C. and smaller than or equal to +10 ppb/° C.

According to the oscillator of this application example, a slope of frequency deviation at a temperature of an end of a desired temperature range, for example, at a temperature of an end of a temperature compensation range further decreases, and thus, it is possible to further increase frequency stability.

APPLICATION EXAMPLE 7

In the oscillator according to the application example, the second container may include a second lid which overlaps the first container and the integrated circuit in a planar view, the inner surface may include a surface on which wires are disposed, and a surface on which the second lid is exposed, and the first container may be disposed on a surface on which the wires are disposed.

According to the oscillator of this application example, frequency stability is greater than that of the related art, and degree of freedom of an electrical connection between the resonator element and the integrated circuit increases.

APPLICATION EXAMPLE 8

An electronic apparatus according to this application example includes any of the oscillators described above.

APPLICATION EXAMPLE 9

A moving object according to this application example includes any of the oscillators described above.

According to these application examples, a temperature compensated oscillator is used in which frequency stability is greater than that of the related art, and thus, for example, it is also possible to realize an electronic apparatus and a moving object which have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. The embodiments which will be described hereinafter do not unduly limit the content of the invention described in the scope of the appended claims. In addition, the entire configurations which will be described hereinafter are not limited as essential configuration requirements of the invention.

1. Oscillator
Configuration of Oscillator

Figure 1:
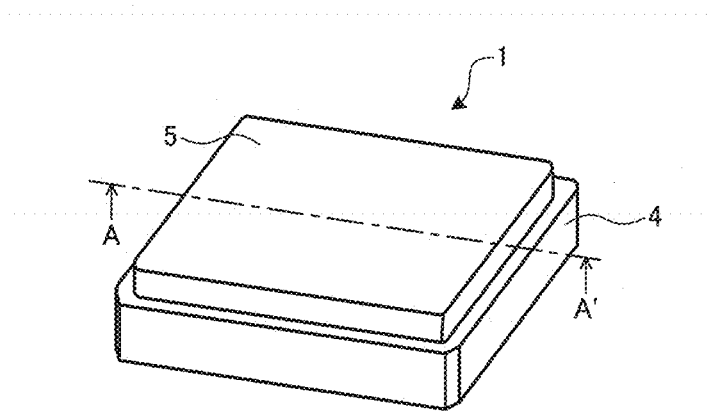
FIG. 1 is a perspective view of an oscillator according to the present embodiment.
Figure 2A:
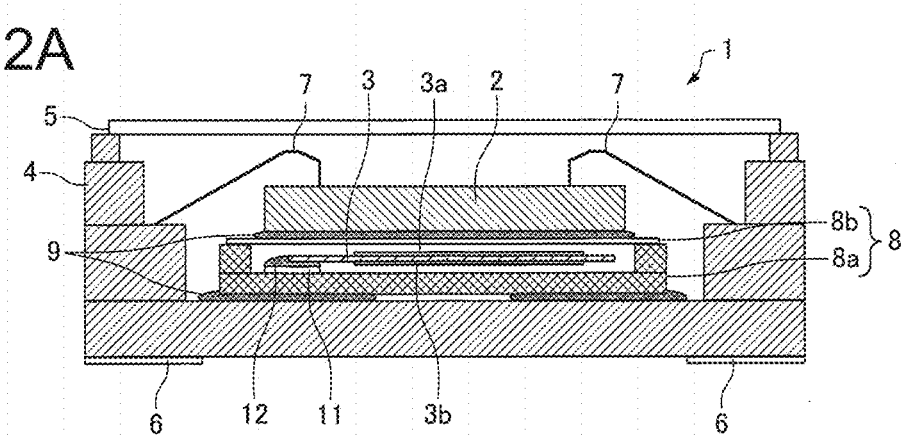
FIG. 2A is a sectional view of the oscillator according to the present embodiment.
Figure 2B:
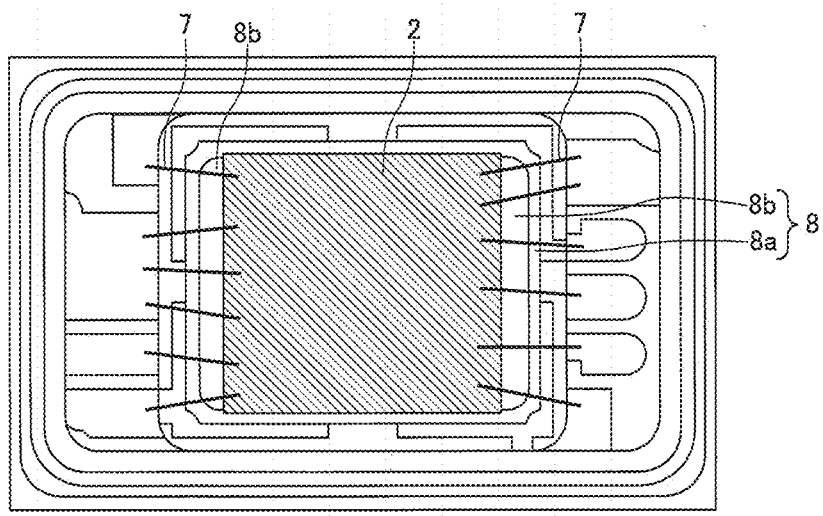
FIG. 2B is a top view of the oscillator according to the present embodiment.
Figure 2C:
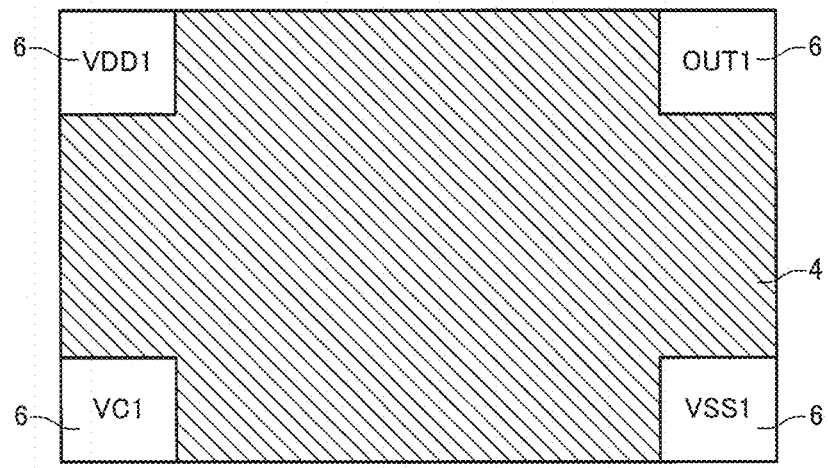
FIG. 2C is a bottom view of the oscillator.

FIG. 1 and FIGS. 2A to 2C are views illustrating an example of a configuration of an oscillator according to the present embodiment. FIG. 1 is a perspective view of the oscillator, FIG. 2A is a sectional view taken along line A-A' of FIG. 1, FIG. 2B is a top view of the oscillator, and FIG. 2C is a bottom view of the oscillator. However, FIG. 2B is illustrated in a state in which there is no lid 5 of FIG. 2A.

As illustrated in FIG. 1 and FIGS. 2A to 2C, an oscillator 1 according to the present embodiment is configured to include an integrated circuit (IC) 2 that is a semiconductor device, a resonator element (resonator reed) 3, a package 4, the lid (cover) 5, and an external terminal (external electrode) 6.

For example, a crystal resonator element, a surface acoustic wave (SAW) resonace element, other piezoelectric resonator elements or micro electromechanical systems (MEMS) resonator element, or the like can be used as the resonator element 3. A piezoelectric material such as, piezoelectric single crystal such as quartz crystal, lithium tantalate, lithium niobate, the piezoelectric ceramics such as lead zirconate titanate, a silicon semiconductor material, or the like can be used as a substrate material of the resonator element 3. A material which uses piezoelectric effects, or a material which uses electrostatic drive that is performed by Coulomb force may be used as an excitation unit of the resonator element 3.

The package 4 contains the integrated circuit (IC) 2 and the resonator element 3 in the same space. Specifically, a concave section is provided in the package 4, and the package 4 contains the integrated circuit (IC) 2 and the resonator element 3 by covering the concave section using the lid 5. Wires (not illustrated) for electrically connecting two terminals (an XO terminal and an XI terminal of FIG. 3 which will be described below) of the integrated circuit (IC) 2 to two terminals (excitation electrodes 3a and 3b) of the resonator element 3, respectively, are provided in the inside of the package 4 or on a surface of the concave section. In addition, wires (not illustrated) which are electrically connected to each of the external terminals 6 are provided in the inside of the package 4 or on the surface of the concave section, and each wire is bonded to each terminal of the integrated circuit (IC) 2 by bonding wires 7 of gold or the like.

As illustrated in FIG. 2C, an external terminal VDD1 that is a power supply terminal, an external terminal VSS1 that is a ground terminal, an external terminal VC1 that is a terminal to which a signal for a frequency control is input, and four external terminals 6 of an external terminal OUT1 that is an output terminal are provided on a bottom surface (a rear surface of the package 4) of the oscillator 1. A power supply voltage is supplied to the external terminal VDD1, and the external terminal VSS1 is grounded.

The resonator element 3 includes the excitation electrodes 3a and 3b of a metal on a front surface and a rear surface thereof, respectively, and oscillates at a desired frequency (frequency required by the oscillator 1) corresponding to mass of the resonator element 3 including the excitation electrodes 3a and 3b.

In the present embodiment, the resonator element 3 is contained in a package (container) 8 (the resonator element 3 is fixed to an electronic pad 11 which is disposed on a base 8a by a connection member 12 such as conductive adhesive). The package 8 includes the base 8a and a lid 8b (cover) which seals the base 8a, and the base 8a is bonded to the package 4 by an adhesive member 9 such as a resin. In addition, the integrated circuit (IC) 2 is bonded to the lid 8b by the adhesive member 9.

As illustrated in FIG. 2B, in a planar view in which the oscillator 1 is viewed from an upper surface thereof, the integrated circuit (IC) 2 overlaps the package 8 (the resonator element 3), and the integrated circuit (IC) 2 is directly attached to the lid 8b of the package 8 which contains the resonator element 3. As a result, heat of the integrated circuit (IC) 2 is conducted to the resonator element 3 for a short time, and thus, a temperature difference between the integrated circuit (IC) 2 and the resonator element 3 decreases, and an error of temperature compensation performed by, for example, a temperature compensation circuit 40 which will be described below is reduced. Hence, a structure of the oscillator 1 illustrated in FIGS. 2A to 2C is more effective to increase frequency accuracy. It is preferable that a material of the lid 8b is metal with high thermal conductivity.

Figure 3:
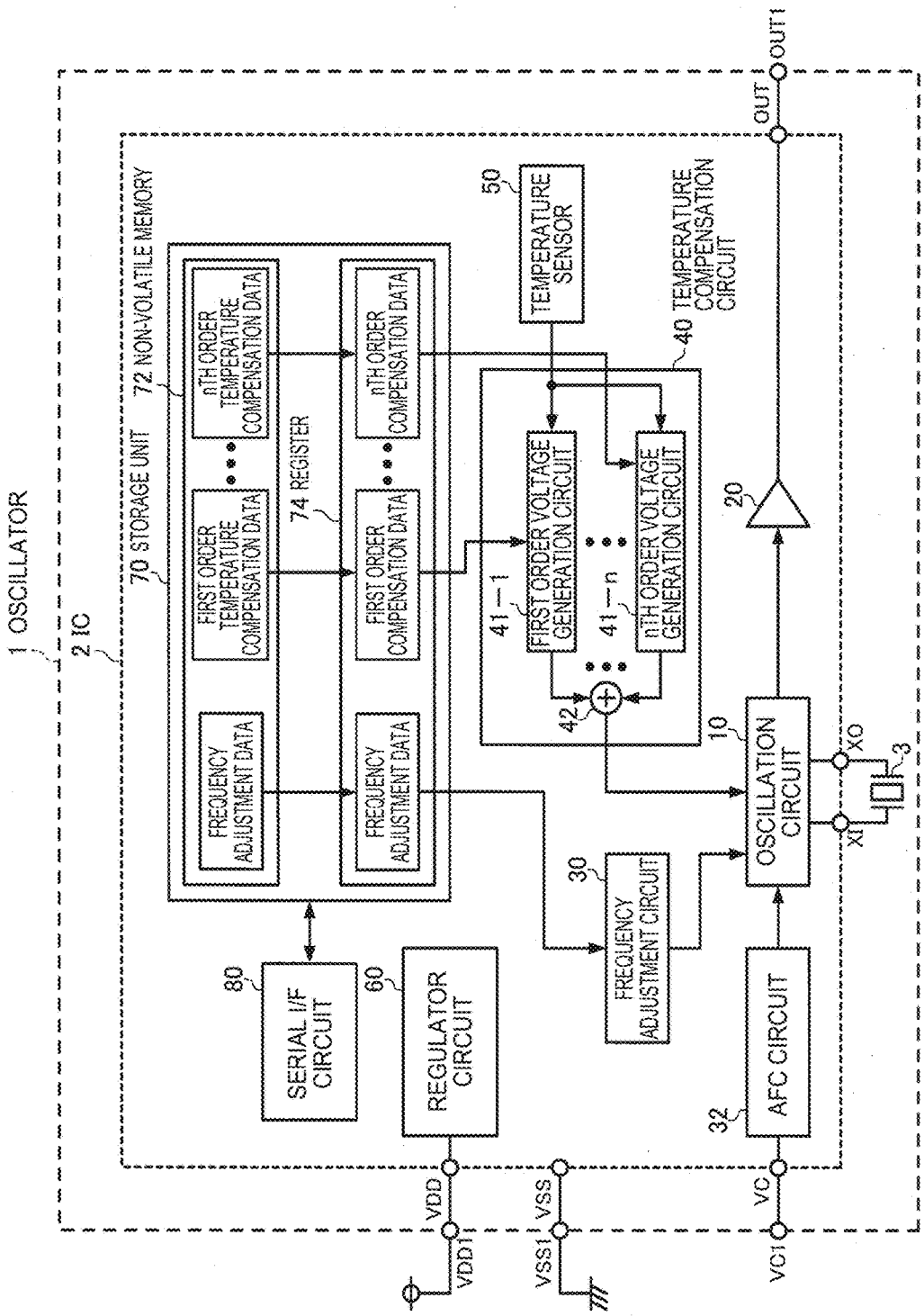
FIG. 3 is a functional block diagram of the oscillator according to the present embodiment.

FIG. 3 is a functional block diagram of the oscillator 1. As illustrated in FIG. 3, the oscillator 1 includes the resonator element 3 and the integrated circuit (IC) 2 for oscillating the resonator element 3, and the integrated circuit (IC) 2 and the resonator element 3 are contained in the package 4.

The integrated circuit (IC) 2 includes a VDD terminal that is a power supply terminal, a VSS terminal that is a ground terminal, an OUT terminal that is an output terminal, a VC terminal to which a signal that controls a frequency is input, an XI terminal and an XO terminal that are connection terminals connected to the resonator element 3. The VDD terminal, the VSS terminal, the OUT terminal, and the VC terminal are exposed on a surface of the integrated circuit (IC) 2, and are respectively connected to external terminals VDD1, VSS1, OUT1, and VC1 which are provided in the package 4. In addition, the XI terminal is connected to one terminal (terminal on a side) of the resonator element 3, and the XO terminal is connected to the other terminal (terminal on the other side) of the resonator element 3.

In the present embodiment, the integrated circuit (IC) 2 is configured to include an oscillation circuit 10, an output circuit 20, a frequency adjustment circuit 30, an automatic frequency control (AFC) circuit 32, a temperature compensation circuit 40, a temperature sensor 50, a regulator circuit 60, a storage unit 70, and a serial interface (I/F) circuit 80. The integrated circuit (IC) 2 may have a configuration in which a part of the elements is omitted or changed, or may have a configuration in which other elements are added.

The regulator circuit 60 generates a part or all of a power supply voltage, or a constant voltage which becomes a reference voltage of the oscillation circuit 10, the frequency adjustment circuit 30, the AFC circuit 32, the temperature compensation circuit 40, and the output circuit 20, based on the power supply voltage VDD (positive voltage) which is supplied to the VDD terminal.

The storage unit 70 includes a non-volatile memory 72 and a register 74, and is configured to be able to perform reading of data from or writing of data to the non-volatile memory 72 or the register 74 from an external terminal through the serial interface circuit 80. In the present embodiment, the terminals of the integrated circuit (IC) 2 which are connected to the external terminals of the oscillator 1 are just four terminals of VDD, VSS, OUT, and VC, and thus, for example, when a voltage at the VDD terminal is higher than a threshold, the serial interface circuit 80 receives a clock signal which is input from the VC terminal and a data signal which is input from the OUT terminal, and performs reading of data from or writing of data to the non-volatile memory 72 or the register 74.

The non-volatile memory 72 is a storage unit for storing various control data, and may be various rewritable non-volatile memories, such as, an electrically erasable programmable read-only memory (EEPROM) or a flash memory, or may be various rewritable non-volatile memories such as a one-time programmable read only memory (PROM).

The non-volatile memory 72 stores frequency adjustment data for controlling the frequency adjustment circuit 30 or temperature compensation data (first order compensation data, . . . , nth order compensation data) for controlling the temperature compensation circuit 40. Furthermore, the non-volatile memory 72 also stores data (not illustrated) for respectively controlling the output circuit 20 and the AFC circuit 32.

The frequency adjustment data is data for adjusting the frequency of the oscillator 1, and if the frequency of the oscillator 1 is shifted from a desired frequency, the frequency adjustment data is rewritten, and thus fine adjustment can be made such that the frequency of the oscillator 1 approximates a desired frequency.

The temperature compensation data (first order compensation data, . . . , nth order compensation data) is calculated during temperature compensation adjustment of the oscillator 1, is data for compensating for frequency temperature characteristics of the oscillator 1, and may be first to nth order coefficient values according to each order component of the frequency temperature characteristics of the resonator element 3. Here, a value which negates frequency temperature characteristics of the resonator element 3, and furthermore, can also compensate for the influence of the temperature characteristics of the integrated circuit (IC) 2 is selected as the maximum order n of the temperature compensation data. For example, n may be an integer value which is greater than a major order of the frequency temperature characteristics of the resonator element 3. For example, if the resonator element 3 is an AT cut quartz crystal resonator element, the frequency temperature characteristics exhibit a third curved line, a major order thereof is 3, and thus, an integer value (for example, 5 or 6) which is greater than 3 may be selected as n. The temperature compensation data may include all of the first to nth order compensation data, and may include only a part of the first to nth order compensation data.

Each piece of the data that is stored in the non-volatile memory 72 is transferred from the non-volatile memory 72 to the register 74, and retained in the register 74, when a power supply voltage is supplied to the integrated circuit (IC) 2 (when the voltage at the VDD terminal increases from zero volts to a desired voltage). Then, frequency adjustment data which is retained in the register 74 is input to the frequency adjustment circuit 30, the temperature compensation data (first order compensation data, . . . , nth order compensation data) which is retained in the register 74 is input to the temperature compensation circuit 40, and data for each control which is retained in the register 74 is also input to the output circuit 20 or the AFC circuit 32.

If it is not possible to rewrite data to the non-volatile memory 72, when the oscillator 1 is inspected, each piece of data is directly written to each bit of the register 74 which retains each piece of data that is transferred from the non-volatile memory 72, from an external terminal through the serial interface circuit 80, and thereby the oscillator 1 is adjusted and selected so as to satisfy desired characteristics, and each piece of data which is adjusted and selected is finally written to the non-volatile memory 72. In addition, if the non-volatile memory 72 is rewritable, when the oscillator 1 is inspected, each piece of data may be written to the non-volatile memory 72 from an external terminal through the serial interface circuit 80. However, since writing to the non-volatile memory 72 takes time in general, each piece of data may be directly written to each bit of the register 74 from an external terminal through the serial interface circuit 80, and each piece of data which is adjusted and selected may be finally written to the non-volatile memory 72, in order to reduce inspection time, when the oscillator 1 is inspected.

The oscillation circuit 10 amplifies an output signal of the resonator element 3 for feeding back to the resonator element 3, and thereby the resonator element 3 oscillates and an oscillation signal is output based on the oscillation of the resonator element 3. For example, a current at an oscillation stage of the oscillation circuit 10 is controlled by the control data that is retained in the register 74.

The frequency adjustment circuit 30 generates a voltage according to the frequency adjustment data that is retained in the register 74, and applies the voltage to one terminal of a variable capacitance element (not illustrated) which functions as a load capacitor of the oscillation circuit 10. As a result, an oscillation frequency (reference frequency) of the oscillation circuit 10 at predetermined temperature (for example, 25° C.) and in a condition in which a voltage at the VC terminal becomes a predetermined voltage (for example, VDD/2) is controlled (finely adjusted) so as to be approximately a desired frequency.

The AFC circuit 32 generates a voltage according to a voltage at the VC terminal, and applies the voltage to one terminal of a variable capacitance element (not illustrated) which functions as a load capacitor of the oscillation circuit 10. As a result, the oscillation frequency (oscillation frequency of the resonator element 3) of the oscillation circuit 10 is controlled based on a voltage value of the VC terminal. For example, a gain of the AFC circuit 32 may be controlled by the control data that is retained in the register 74.

The temperature sensor 50 is a temperature sensing element which outputs a signal (for example, a voltage corresponding to temperature) corresponding to temperature of periphery thereof. The temperature sensor 50 may have positive polarity in which the higher the temperature is, the more an output voltage increases, or may have negative polarity in which the higher temperature is, the more an output voltage decreases. It is preferable that an output voltage of the temperature sensor 50 changes with respect to a temperature change as linearly as possible, in a desired temperature range in which an operation of the oscillator 1 is guaranteed.

The temperature compensation circuit 40 receives an output signal from the temperature sensor 50, generates a voltage (temperature compensation voltage) for compensating for frequency temperature characteristics of the resonator element 3, and applies the voltage to one terminal of a variable capacitance element (not illustrated) which functions as a load capacitor of the oscillation circuit 10. As a result, the oscillation frequency of the oscillation circuit 10 is controlled so as to be approximately constant regardless of temperature. In the present embodiment, the temperature compensation circuit 40 is configured to include a first order voltage generation circuit 41-1 to an nth order voltage generation circuit 41-n, and an addition circuit 42.

The first order voltage generation circuit 41-1 to the nth order voltage generation circuit 41-n respectively receive the output signal of the temperature sensor 50, and generate a first order compensation voltage to an nth order compensation voltage which compensate frequency temperature characteristics from first order components to nth order components, according to first compensation data to nth order compensation data that are retained in the register 74.

The addition circuit 42 adds the first order compensation voltage to the nth order compensation voltage to each other which are respectively generated by the first order voltage generation circuit 41-1 to the nth order voltage generation circuit 41-n, and outputs the voltages. An output voltage of the addition circuit 42 becomes an output voltage (temperature compensation voltage) of the temperature compensation circuit 40.

The output circuit 20 receives an oscillation signal which is output from the oscillation circuit 10, generates an oscillation signal for an external output, and outputs the oscillation signal to the outside through the OUT terminal. For example, a frequency division ratio or an output level of the oscillation signal of the output circuit 20 may be controlled by the control data which is retained in the register 74.

The oscillator 1 which is configured as described above functions as a temperature compensated oscillator of a voltage control type (a voltage controlled temperature compensated crystal oscillator (VC-TCXO), if the resonator element 3 is a quartz crystal resonator element) which outputs an oscillation signal of a constant frequency corresponding to a voltage of the external terminal VC1 in a desired temperature range, regardless of temperature.

Method of Manufacturing Oscillator

Figure 4:
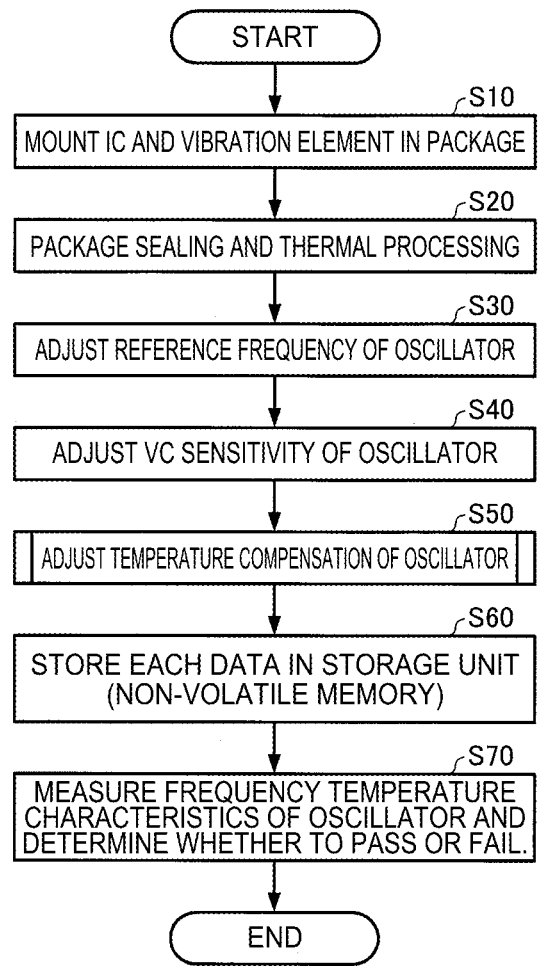
FIG. 4 is a flowchart illustrating an example of the sequence of a method of manufacturing the oscillator.

FIG. 4 is a flowchart illustrating an example of the sequence of a method of manufacturing the oscillator 1 according to the present embodiment. A part of step S10 to S70 of FIG. 4 may be omitted or changed, or other steps may be added thereto. In addition, the sequence of each step may be appropriately changed in a possible range.

In an example of FIG. 4, the integrated circuit (IC) 2 and the resonator element 3 (the package 8 which contains the resonator element 3) are first mounted in the package 4 (S10). In step S10, the integrated circuit (IC) 2 is connected to the resonator element 3 by a wire which is provided in the inside of the package 4 or on a surface of the concave portion, and if a power supply is supplied to the integrated circuit (IC) 2, the integrated circuit (IC) 2 is electrically connected to the resonator element 3.

Subsequently, the package 4 is sealed with the lid 5, and the lid 5 adheres to the package 4 by thermal processing (S20). Assembly of the oscillator 1 is completed in step S20.

Subsequently, a reference frequency (frequency at reference temperature T0 (for example, 25° C.)) of the oscillator 1 is adjusted (S30). In step S30, a frequency is measured by oscillating the oscillator 1 at the reference temperature T0, and frequency adjustment data is determined such that frequency deviation approximates zero.

Subsequently, VC sensitivity of the oscillator 1 is adjusted (S40). In step S40, at the reference temperature T0, a frequency is measured by oscillating the oscillator 1 in a state in which a predetermined voltage (for example, 0 V or VDD) is applied to the external terminal VC1, and adjustment data of the AFC circuit 32 is determined such that a desired VC sensitivity is obtained.

Subsequently, temperature compensation adjustment of the oscillator 1 is performed (S50). The temperature compensation adjustment step S50 will be described in detail below.

Subsequently, each piece of data which is obtained in steps S30, S40, and S50 is stored in the non-volatile memory 72 of the storage unit 70 (S60).

Finally, acceptability of the frequency temperature characteristics of the oscillator 1 is determined (S70). In step S70, frequencies of the oscillator 1 are measured while gradually changing the temperature, and it is evaluated whether or not the frequency deviation is within a predetermined range in a desired temperature range (for example, from −40° C. or higher to 85° C. or lower). It is determined that the oscillator is good if frequency deviation thereof is within a predetermined range, and the oscillator fails if frequency deviation thereof is out of the predetermined range.

Frequency Temperature Characteristics of Oscillator

In general, in the temperature compensation adjustment step, the frequency of the oscillator 1 is measured at multiple temperatures in a desired temperature range (for example, from −40° C. to 85° C.), the frequency temperature characteristics of the oscillator is approximated by an nth order equation which uses temperature (an output voltage of a temperature sensor) as a variable by using the measurement result, frequency deviation of a reference temperature T0 is set to zero, and temperature compensation data (first order compensation data, . . . , nth order compensation data) which reduces the width of the frequency deviation in a desired temperature range is generated.

Figure 5:
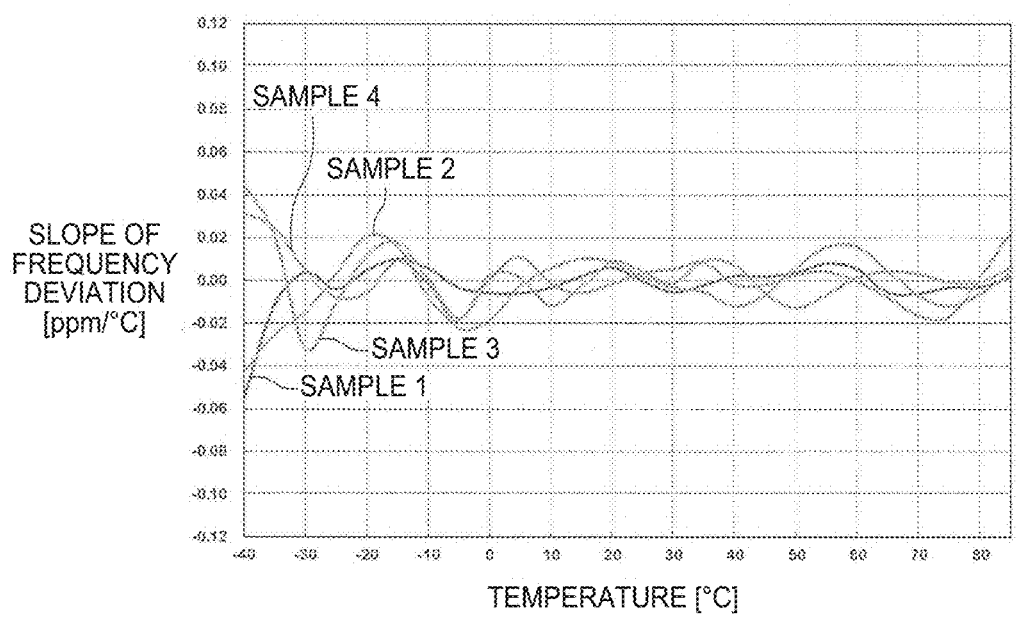
FIG. 5 is a diagram illustrating examples of a slope of frequency deviation of a temperature compensated oscillator of the related art.

FIG. 5 is a diagram illustrating examples of a slope (slope of frequency deviation with respect to temperature, which is obtained by differentiating frequency deviation by temperature) of frequency deviation of four samples of a temperature compensated oscillator of the related art which compensates for temperature, using temperature compensation data which is obtained by general temperature compensation adjustment step. In FIG. 5, a horizontal axis denotes temperature (unit: ° C.), and a vertical axis denotes frequency deviation (unit: ppm). As illustrated in FIG. 5, the slopes (absolute values) of the frequency deviations of all the samples become maximum at a temperature (temperature of an end of a temperature compensation range) of −40° C. in a boundary between the temperature compensation range (from −40° C. to 85° C.) and the outside of the range, and exceed ±0.025 ppm/° C. (=±25 ppb/° C.). That is, by setting the frequency deviation of the reference temperature T0 (for example, 25° C.) to zero, a frequency change amount of the oscillator with respect to a temperature change becomes greatest near the temperature of the end of the temperature compensation range in which a difference between the temperature of the samples and the reference temperature T0 is the greatest.

Hence, even if the frequency deviation of the oscillator in the temperature compensation range is within a predetermined range, frequency variation with respect to a temperature change increases at a temperature of the end of the temperature compensation range, and properties, which are used as an evaluation index of frequency stability, such as Allan deviation (ADEV), time deviation (TDEV), or maximum time interval error (MTIE) become degraded.

Figure 6:
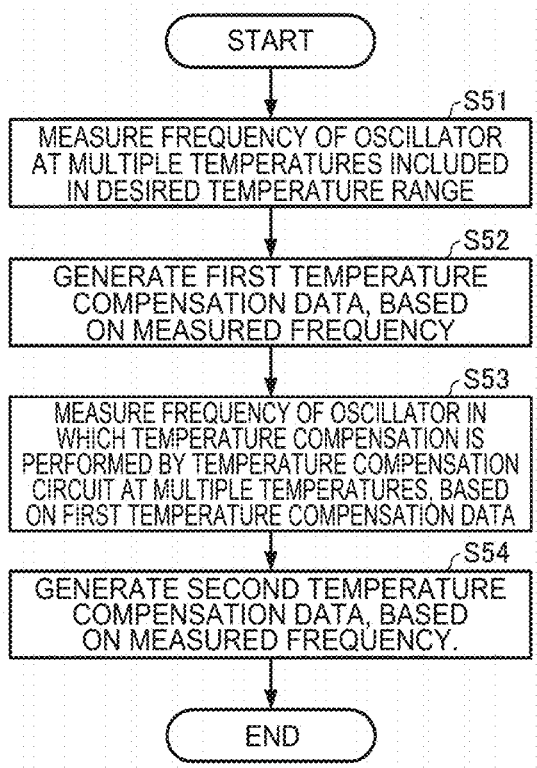
FIG. 6 is a flowchart illustrating an example of the sequence of a temperature compensation adjustment step according to the present embodiment.

Hence, in the present embodiment, temperature compensation data which reduces the slope of the frequency deviation at a temperature of the end of the temperature compensation range is generated in the temperature compensation adjustment step S50 of FIG. 4. FIG. 6 is a flowchart illustrating an example of the sequence of the temperature compensation adjustment step (S50 of FIG. 4) according to the present embodiment. It is assumed that each piece of data which is obtained in steps S30 and S40 of FIG. 4 is stored in the register 74 at the time when the flowchart of FIG. 6 is started.

In FIG. 6, firstly, the frequency of the oscillator 1 is measured at multiple temperatures which are included in a desired temperature range (for example, a temperature range from $-40°$ C. to $85°$ C.) (S51), and first temperature compensation data (first order compensation data, . . . , nth order compensation data) is generated, based on the frequency which is measured in step S51 (S52). In step S51, the frequency temperature characteristics of the oscillator 1 in which temperature compensation is not made are acquired. In step S52, for example, a calculation program of the temperature compensation data approximates the frequency temperature characteristics of the oscillator 1 which are measured in step S51 to an nth order equation which uses temperature (output voltage of the temperature sensor 50) as a variable, frequency deviation of the reference temperature T0 is set to zero, and first temperature compensation data which reduces the width of the frequency deviation in a desired temperature range is generated. The steps S51 and S52 (first temperature compensation adjustment step) are the same as the general temperature compensation adjustment steps described above.

Subsequently, the first temperature compensation data obtained by measuring the frequency of the oscillator 1 at multiple temperatures is not stored in the non-volatile memory 72, the frequency of the oscillator 1 which is temperature-compensated for by the temperature compensation circuit 40 based on the first temperature compensation data is measured at multiple temperatures (S53), and the second temperature compensation data (first order compensation data, . . . , nth order compensation data) is generated based on the frequency measured in step S53 (S54). In step S53, the frequency of the oscillator 1 which is temperature-compensated for based on the first temperature compensation data generated in step S52 is measured at temperatures, for example, more than those of step S51, and frequency temperature characteristics of the oscillator 1 are acquired. In step S54, for example, a calculation program of the temperature compensation data approximates the frequency temperature characteristics of the oscillator 1 measured in step S53 to nth order equation which uses temperature (output voltage of the temperature sensor 50) as a variable, and generates the second temperature compensation data which reduces the slope of frequency deviation at the temperature of the end of the temperature compensation range. For example, in step S54, the calculation program of the temperature compensation data may make the frequency deviation at the temperature of the end of the temperature compensation range come closer to zero (as a result, the slope of the frequency deviation is reduced), and the second temperature compensation data which adjusts the width of the frequency deviation at a desired temperature range to be within a predetermined range may be generated. In steps S53 and S54 (second temperature compensation adjustment steps), the second temperature compensation data may be generated such that the slope of the frequency deviation at a temperature of the end of the temperature compensation range is larger than or equal to $-20$ ppb/° C. and smaller than or equal to $+20$ ppb/° C.

Then, the second temperature compensation data obtained in step S54 is stored in the non-volatile memory 72 in step S60 of FIG. 6 as the aforementioned temperature compensation data (first order compensation data, . . . , nth order compensation data).

Then, the frequency temperature characteristics of the oscillator 1 are confirmed by operating the temperature compensation circuit 40 according to the data stored in the non-volatile memory 72 if necessary.

Figure 7:
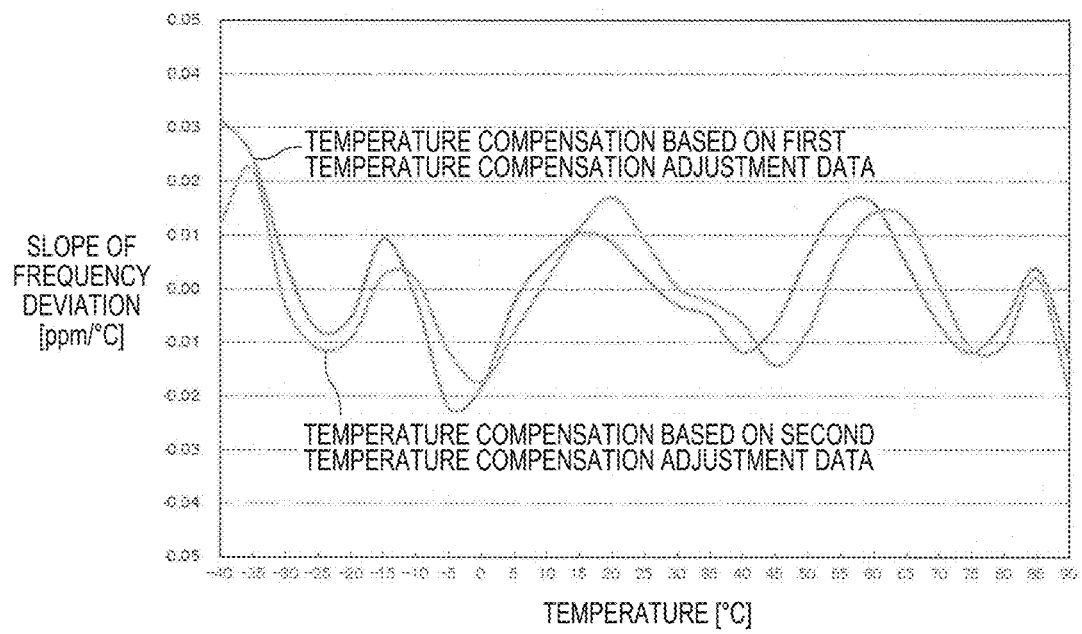
FIG. 7 is a diagram illustrating examples of a slope of the frequency deviation of the oscillator according to the present embodiment.

FIG. 7 is a diagram illustrating examples of the slope (which is obtained by differentiating the frequency deviation with temperature) of the frequency deviation of the oscillator 1 according to the present embodiment. In FIG. 7, a horizontal axis denotes temperature (unit: ° C.), and a vertical axis denotes frequency deviation (unit: ppm). FIG. 7 illustrates a graph of the slope of frequency deviation, in a case in which temperature compensation is performed based on the first temperature compensation data obtained in steps S51 and S52 (first temperature compensation adjustment steps) of FIG. 6, and in a case in which temperature compensation is performed based on the second temperature compensation data obtained in steps S53 and S54 (second temperature compensation adjustment steps) of FIG. 6.

As illustrated in FIG. 7, the slope of the frequency deviation in a case in which temperature compensation is performed based on the first temperature compensation data exceeds $+0.03$ ppm/° C. ($=+30$ ppb/° C.), at $-40°$ C. which is the temperature of the end of the temperature compensation range (from $-40°$ C. to $85°$ C.), but the slope of the frequency deviation in a case in which temperature compensation is performed based on the second temperature compensation data is improved to the slope smaller than or equal to $+0.02$ ppm/° C. ($=+20$ ppb/° C.). Hence, the oscillator 1 according to the present embodiment which performs temperature compensation based on the second temperature compensation data has increased frequency stability at $-40°$ C. which is the temperature of the end of the temperature compensation range (from $-40°$ C. to $85°$ C.), compared to a general oscillator which performs temperature compensation based on the first temperature compensation data.

In addition, in the examples of FIG. 7, in a case in which temperature compensation is performed based on the second temperature compensation data, the slope of the frequency deviation near the reference temperature ($25°$ C.) increases, but a range of the slope of the frequency deviation in a temperature compensation range (from $-40°$ C. to $85°$ C.) decreases to a range from $-0.025$ ppm/° C. ($=-25$ ppb/° C.) to $+0.025$ ppm/° C. ($=+25$ ppb/° C.), compared to a case in which temperature compensation is performed based on the first temperature compensation data. That is, in the temperature compensation range, the maximum value (value smaller than or equal to $0.025$ ppm/° C.) of the slope of the frequency deviation in a case in which temperature compensation is performed based on the second temperature compensation data is smaller than the maximum value (value greater than or equal to $0.03$ ppm/° C.) of the slope of the frequency deviation in a case in which temperature compensation is performed based on the first temperature compensation data. Hence, the oscillator 1 according to the present embodiment which performs temperature compensation using the second temperature compensation data has increased frequency stability at each temperature in the temperature compensation range (from −40° C. to 85° C.), compared to a general oscillator which performs temperature compensation using the first temperature compensation data.

In steps S53 and S54 (second temperature compensation adjustment steps), the second temperature compensation data may be generated such that the slope of the frequency deviation at a temperature of the end of the temperature compensation range is larger than or equal to −10 ppb/° C. and smaller than or equal to +10 ppb/° C. In the example of FIG. 7, since the slope of the frequency deviation at −40° C. in a case in which temperature compensation is performed using the second temperature compensation data is approximately a little larger than +0.01 ppm/° C. (=+10 ppb/° C.), for example, if a range of the slope of the frequency deviation in a temperature compensation range (from −40° C. to 85° C.) is slightly increased, the slope can also be smaller than or equal to +0.01 ppm/° C. (=+10 ppb/° C.).

Effects

As described above, in the present embodiment, in the second temperature compensation adjustment steps (S53 and S54 of FIG. 6), the frequency of the oscillator 1 which is obtained by performing temperature compensation based on the first frequency data obtained in the first temperature compensation adjustment steps (S51 and S52 of FIG. 6) is measured at multiple temperatures, and the second temperature compensation data is generated based on the measured frequency. Hence, even in a case in which the frequency of the oscillator 1 in which temperature compensation is performed based on the first temperature compensation data rapidly changes at a temperature of the end of the temperature compensation range, the frequency of the oscillator 1 in which temperature compensation is performed based on the first temperature compensation data is added, and thereby the second temperature compensation data which makes a frequency change at a temperature of the end of the temperature compensation range gentler can be generated. Particularly, in the second temperature compensation adjustment steps, the second temperature compensation data is generated by the temperature compensation circuit 40, such that the slope of the frequency deviation at a temperature of the end of the temperature compensation range is made to the slope which is larger than or equal to −20 ppb/° C. and smaller than or equal to +20 ppb/° C., and thereby, it is possible to provide the temperature compensated oscillator 1 in which the slope of the frequency deviation at a temperature of the end of the temperature compensation range is smaller (larger than or equal to −20 ppb/° C. and smaller than or equal to +20 ppb/° C.) than that of the related art, and frequency stability (characteristics, such as ADEV, TDEV, or MTIE) is higher than that of the related art, even though a memory (one time programmable memory) which can be rewritten so-called one time only such as the non-volatile memory 72 is used without using a memory which can be rewritten multiple times.

In addition, in the second temperature compensation adjustment steps, the second temperature compensation data is generated by the temperature compensation circuit 40, such that the slope of the frequency deviation at a temperature of the end of the temperature compensation range is made to the slope which is larger than or equal to −10 ppb/° C. and smaller than or equal to +10 ppb/° C., and thereby, it is possible to provide the temperature compensated oscillator 1 in which the slope of the frequency deviation at a temperature of the end of the temperature compensation range further decreases (larger than or equal to −10 ppb/° C. and smaller than or equal to +10 ppb/° C.), and frequency stability further increases.

In addition, in the temperature compensation range which is adjusted by the temperature compensation circuit 40, the maximum value of the slope of the frequency deviation in a case in which temperature compensation is performed based on the second temperature compensation data is smaller than the maximum value of the slope of the frequency deviation in a case in which temperature compensation is performed based on the first temperature compensation data, and thus, it is possible to provide the temperature compensated oscillator 1 which has increased frequency stability at each temperature in the temperature compensation range.

In the temperature compensation adjustment step S50 of FIG. 4, it is preferable that the frequency temperature characteristics (including frequency temperature characteristics of the resonator element 3 and the frequency temperature characteristics of the integrated circuit (IC) 2) of the oscillator 1 are approximated more correctly. Here, since frequency temperature characteristics of the resonator element 3 is dominant in the frequency temperature characteristics of the oscillator 1, it is preferable that the frequency temperature characteristics of the resonator element 3 approximate more correctly, in other words, frequency deviation with respect to an approximation equation of the frequency temperature characteristics of the resonator element 3 is smaller.

Figure 8:
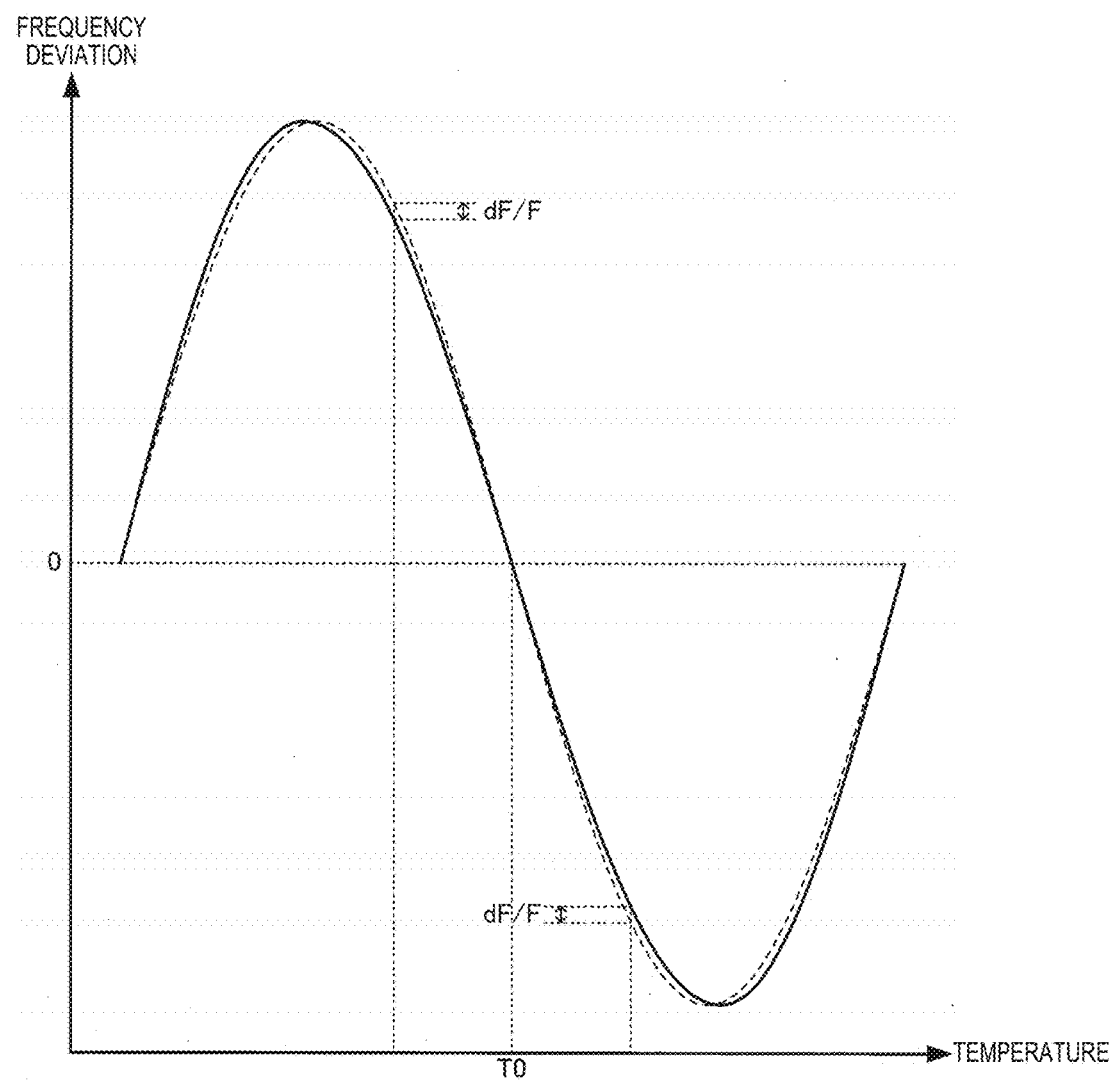
FIG. 8 is an explanatory diagram illustrating frequency deviation of the resonator element.

For example, if the resonator element 3 is an AT cut resonator element, frequency temperature characteristics (a solid line of FIG. 8) thereof exhibit a third order curved line (major order is 3) as illustrated in FIG. 8, and thus, it is preferable that the frequency deviation dF/F of the resonator element 3 with respect to an approximation equation (dashed line of FIG. 8) of a third order or more of the frequency temperature characteristics of the resonator element 3 is as small as possible. According to this, in the temperature compensation adjustment step S50, the second temperature compensation data for realizing the oscillator 1 which has small frequency deviation in the temperature compensation range (for example, from −40° C. to +85° C.) is easily generated, even if variations of the temperature characteristics of the integrated circuit (IC) 2 are taken into account. As a result, in step S70 of FIG. 4, if it is evaluated whether or not the frequency deviation is within a predetermined range, a probability that products pass increases, and thus, it is possible to increase yield.

Since the frequency temperature characteristics of the resonator element 3 change depending upon parameters such as, positions or shapes of the excitation electrodes 3a and 3b, or a shape or size of the resonator element 3, it is possible to realize the resonator element 3 with smaller frequency deviation dF/F, by determining parameter values such that a dip does not occur in the frequency temperature characteristics, for example, even at an upper limit or a lower limit of variation of characteristics at the time of mass production, in a design step of the resonator element 3.

Furthermore, in the temperature compensation adjustment step S50, it is efficient that, in order to further reflect the temperature characteristics of the integrated circuit (IC) 2 to the second temperature compensation data to be generated, the frequency temperature characteristics of the oscillator 1 approximate to higher order equations. For example, if the resonator element 3 is an AT cut resonator element, it is preferable that the frequency temperature characteristics of the oscillator 1 approximate to equations which are higher than or equal to a fifth order. In doing so, in the temperature compensation adjustment step, the second temperature compensation data for realizing the oscillator 1 to which the temperature characteristics of the integrated circuit (IC) 2 are also added, and which has small frequency deviation in a temperature range is easily generated. As a result, it is possible to further increase yield.

The oscillator 1 according to the present embodiment described above is an oscillator (VC-TCXO or the like) having a temperature compensation function and a voltage control function (frequency control function), but may be a temperature compensated oscillator (TCXO or the like) without the voltage control function (frequency control function).

2. Electronic Apparatus

Figure 9:
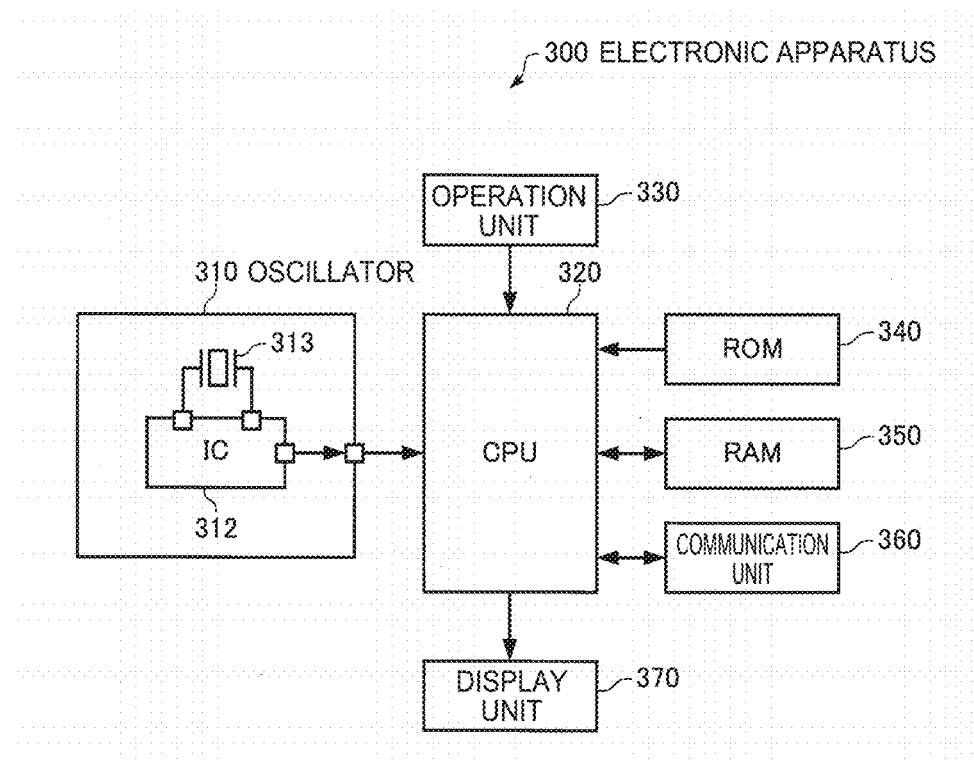
FIG. 9 is a functional block diagram illustrating an example of a configuration of an electronic apparatus according to the present embodiment.
Figure 10:
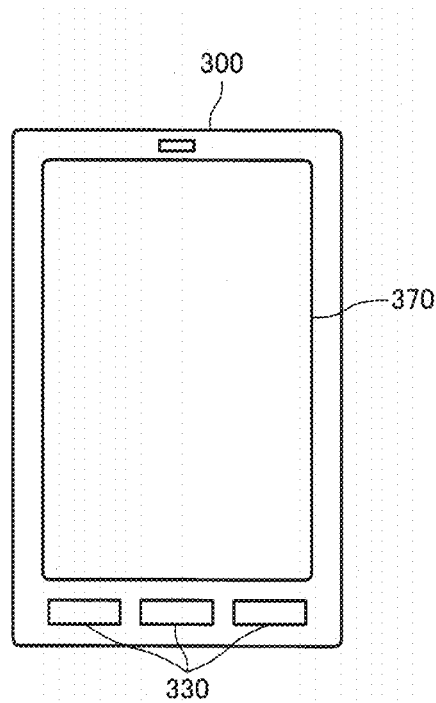
FIG. 10 is a view illustrating an example of an appearance of the electronic apparatus according to the present embodiment.

FIG. 9 is a functional block diagram illustrating an example of a configuration of an electronic apparatus according to the present embodiment. FIG. 10 is a view illustrating an example of an appearance of a smart phone which is an example of the electronic apparatus according to the present embodiment.

An electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. The electronic apparatus according to the present embodiment may have a configuration in which a part of the configuration elements (each unit) of FIG. 9 is omitted or changed, or may have a configuration in which other configuration elements are added.

The oscillator 310 includes an integrated circuit (IC) 312 and a resonator element 313. The integrated circuit (IC) 312 generates an oscillation signal by oscillating the resonator element 313. The oscillation signal is output from an external terminal of the oscillator 310 to the CPU 320.

The CPU 320 performs various types of calculation processing or control processing, using the oscillation signal which is input from the oscillator 310 as a clock signal, according to a program that is stored in the read only memory (ROM) 340 or the like. Specifically, the CPU 320 performs various types of processing according to an operation signal from the operation unit 330, processing of controlling the communication unit 360 for performing data communication with an external device, processing of transmitting a display signal for displaying various types of information in the display unit 370, or the like.

The operation unit 330 is an input device which is configured by operation keys, button switches, or the like, and outputs operation signals according to operations performed by a user to the CPU 320.

The ROM 340 stores programs for performing various types of calculation processing or control processing by the CPU 320, data, or the like.

The RAM 350 is used as a working area of the CPU 320, and temporarily stores programs or data that are read from the ROM 340, data which is input from the operation unit 330, arithmetic results that are obtained by executing various programs by the CPU 320, or the like.

The communication unit 360 performs various controls for performing data communication between the CPU 320 and an external device.

The display unit 370 is a display device which is configured by a liquid crystal display (LCD) or the like, and displays various types of information, based on a display signal which is input from the CPU 320. A touch panel which functions as the operation unit 330 may be provided in the display unit 370.

It is possible to realize an electronic apparatus with high reliability by employing, for example, the above-described oscillator 1 according to the present embodiment as the oscillator 310.

Various types of electronic apparatuses may be used as the electronic apparatus 300. For example, a personal computer (for example, a mobile type personal computer, a laptop type personal computer, a tablet type personal computer), a mobile terminal such as a smart phone or a mobile phone, a digital camera, an ink jet type ejection device (for example, an ink-jet printer), a storage area network apparatus such as a router or a switch, a local area network apparatus, an apparatus for a mobile terminal base station, a television, a video camera, a video recorder, a car navigation device, a real-time clock device, a pager, an electronic organizer (also including a communication function), an electronic dictionary, an electronic calculator, an electronic game apparatus, a controller for game, a word processor, a workstation, a video telephone, a television monitor for crime prevention, electronic binoculars, a POS terminal, a medical apparatus (for example, an electronic thermometer, a blood pressure monitor, a blood glucose meter, an electrocardiogram measuring device, an ultrasonic diagnostic apparatus, an electronic endoscope), a fish finder, various measurement apparatuses, instruments (for example, instruments such as, a vehicle, an aircraft, or a ship), a flight simulator, a head-mounted display, a motion tracing device, a motion tracking device, a motion controller, a pedestrian position orientation measurement (PDR), or the like is used.

As an example of the electronic apparatus 300 according to the present embodiment, a transfer device which functions as, for example, a device for terminal station, or the like which performs wireless or wired communication with a terminal, using the above-described oscillator 310 as a reference signal source, a voltage controlled oscillator (VCO), or the like. By employing, for example, the above-described oscillator 1 according to the present embodiment as the oscillator 310, it is also possible to realize the electronic apparatus 300 which can be used for, for example, a communication station or the like, and which has high frequency accuracy, high performance, and high reliability, at a lower cost than the related art.

In addition, as another example, the electronic apparatus 300 according to the present embodiment may be a communication device in which the communication unit 360 receives an external clock signal, and the CPU 320 (processing unit) includes a frequency control unit that controls the frequency of the oscillator 310, based on the external clock signal and an output signal (internal clock signal) of the oscillator 310. The communication device may be mission-critical network apparatus such as a stratum 3, or a communication apparatus which is used for a femto cell.

A network apparatus is interlinked with a time synchronization network, thereby obtaining correct time. In a network apparatus which is located at a terminal of the time synchronization network, synchronization fault or time variation (time shift) is easily generated. The oscillator 310 according to the present embodiment can have extremely high accurate frequency temperature characteristics which are lower than or equal to 0.1 ppm, and thus, the oscillator corrects the time variation, and can be suitably used for a clock source of an apparatus when the apparatus has synchronization fault. For example, by including the oscillator 310 corresponding to a stratum 3 standard, it is possible to satisfy conditions such as, jitter, wonder, and holdover which are defined in the synchronous Ethernet (SyncE) that defines a communication method of a synchronous Ethernet or the like.

In addition, a femtocell is an extremely small base station which can be installed in an office or a house, among cellular phone stations (cells), and a radius of a radio wave output range which is covered by the femtocell is approximately dozens of meters. The femtocell is connected to a cellular phone network through broad band lines. Even at a place in which a sufficient radio wave situation is rarely secured in a general structure such as an office space surrounded by buildings, it is possible to secure a call by installing a femtocell. In addition, the femtocell attracts attention from a viewpoint in which introduction of fixed mobile convergence (FMC) that is service which combines a mobile phone with a fixed phone using fixed communication lines can be made.

3. Moving Object

Figure 11:
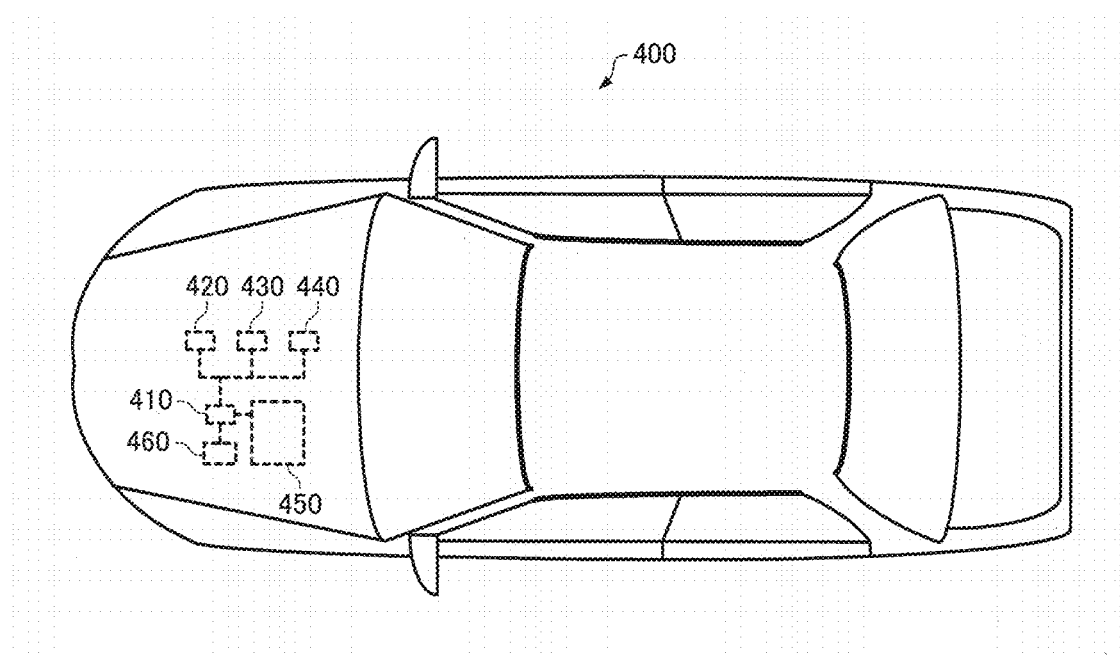
FIG. 11 is a view illustrating an example of a moving object according to the present embodiment.

FIG. 11 is a view (top view) illustrating an example of a moving object according to the present embodiment. A moving object 400 illustrated in FIG. 11 is configured to include an oscillator 410, controllers 420, 430, and 440 which perform various controls of an engine system, a brake system, a keyless entry system, and the like, a battery 450, and a backup battery 460. The moving object according to the present embodiment may have a configuration in which a part of the configuration elements (each unit) of FIG. 11 is omitted, or other configuration elements are added.

The oscillator 410 includes an integrated circuit (IC) and a resonator element which are not illustrated, and the integrated circuit (IC) generates an oscillation signal by oscillating the resonator element. The oscillation signal is output from an external terminal of the oscillator 410 to the controllers 420, 430, and 440, and is used as, for example, a clock signal.

The battery 450 supplies power to the oscillator 410 and the controllers 420, 430, and 440. The backup battery 460 supplies power to the oscillator 410 and the controllers 420, 430, and 440, when an output voltage of the battery 450 is lower than a threshold.

It is possible to realize a moving object with high reliability by employing, for example, the above-described oscillator 1 according to the present embodiment as the oscillator 410.

Various moving objects can be used as the moving object 400. For example, a vehicle (including an electric vehicle), an aircraft such as a jet plane or a helicopter, a ship, a rocket, an artificial satellite, or the like can be used as the moving object 400.

The invention is not limited to the present embodiment, and various modifications can be made within a range of the spirit of the invention.

The above-described embodiments and modification examples are examples, and the invention is not limited to the examples. For example, it is possible to appropriately combine each embodiment and each modification example.

The invention includes substantially the same configuration (for example, a function, a configuration having the same method and effects, or a configuration having the same objective and effects) as the configurations described in the embodiments. In addition, the invention includes a configuration in which non-essential portions of the configurations described in the embodiments are replaced. In addition, the invention includes a configuration in which the same actions and effects, or the same objectives as those of the configurations described in the embodiments can be achieved. In addition, the invention includes a configuration in which a known technology is added to the configuration described in the embodiments.

The entire disclosure of Japanese Patent Application No. 2015-067357, filed Mar. 27, 2015 is expressly incorporated by reference herein.

What is claimed is:

1. A method of manufacturing an oscillator including a resonator element, an oscillation circuit which outputs an oscillation signal by oscillating the resonator element, a temperature compensation circuit which compensates for temperature characteristics of a frequency of the oscillation signal in a desired temperature range, the method comprising:
a first temperature compensation adjustment step in which the frequency is measured at multiple temperatures and first temperature compensation data is calculated based on a relationship between temperature and the frequency; and
a second temperature compensation adjustment step in which, after the first temperature compensation adjustment step, the frequency that is obtained by performing temperature compensation by the temperature compensation circuit based on the first temperature compensation data is measured at multiple temperatures, and second temperature compensation data is calculated based on a relationship between temperature and the frequency,
wherein, in the second temperature compensation adjustment step, the second temperature compensation data is calculated in which a slope of frequency deviation with respect to temperature of the oscillation signal that is compensated for by the temperature compensation circuit is larger than or equal to −20 ppb/° C. and smaller than or equal to +20 ppb/° C. at a temperature of an end of the desired temperature range.

2. The method of manufacturing an oscillator according to claim 1, wherein, in the second temperature compensation adjustment step, the second temperature compensation data is calculated in which the slope of the frequency deviation at a temperature of the end is larger than or equal to −10 ppb/° C. and smaller than or equal to +10 ppb/° C.

3. The method of manufacturing an oscillator according to claim 1, wherein, in the desired temperature range, the maximum value of a slope of frequency deviation with respect to temperature of the oscillation signal in a case in which temperature compensation is performed based on the second temperature compensation data is smaller than the maximum value of a slope of the frequency deviation in a case in which temperature compensation is performed based on the first temperature compensation data.

4. The method of manufacturing an oscillator according to claim 2, wherein, in the desired temperature range, the maximum value of a slope of the frequency deviation in a case in which temperature compensation is performed based on the second temperature compensation data is smaller than the maximum value of a slope of the frequency deviation in a case in which temperature compensation is performed based on the first temperature compensation data.

5. An oscillator comprising:
a resonator element;
an integrated circuit that includes an oscillation circuit which outputs an oscillation signal by oscillating the resonator element, a temperature compensation circuit which compensates for temperature characteristics of a frequency of the oscillation signal in a desired temperature range, and a first surface on which a terminal that is electrically connected to the resonator element is disposed;

a first container which contains the resonator element and includes a first lid of a metal which covers the resonator element; and a second container which contains the first container and the integrated circuit, wherein the first container is disposed such that a surface on a side opposite to the first lid side faces an inner surface of the second container, wherein the integrated circuit has a surface on a side opposite to the first surface bonded to the first lid through an adhesive member, and wherein a slope of frequency deviation with respect to the temperature of the oscillation signal which is compensated for by the temperature compensation circuit is larger than or equal to −20 ppb/° C. and smaller than or equal to +20 ppb/° C. at a temperature of an end of the desired temperature range.

6. The oscillator according to claim 5, wherein the slope of the frequency deviation at a temperature of the end is larger than or equal to −10 ppb/° C. and smaller than or equal to +10 ppb/° C.

7. The oscillator according to claim 5, wherein the second container includes a second lid which overlaps the first container and the integrated circuit in a planar view, wherein the inner surface includes a surface on which wires are disposed, and a surface on which the second lid is exposed, and wherein the first container is disposed on a surface on which the wires are disposed.

8. The oscillator according to claim 6, wherein the second container includes a second lid which overlaps the first container and the integrated circuit in a planar view, wherein the inner surface includes a surface on which wires are disposed, and a surface on which the second lid is exposed, and wherein the first container is disposed on a surface on which the wires are disposed.

9. An electronic apparatus, comprising:
the oscillator according to claim 5.

10. An electronic apparatus, comprising:
the oscillator according to claim 6.

11. An electronic apparatus, comprising:
the oscillator according to claim 7.

12. An electronic apparatus, comprising:
the oscillator according to claim 8.

13. A moving object, comprising:
the oscillator according to claim 5.

14. A moving object, comprising:
the oscillator according to claim 6.

15. A moving object, comprising:
the oscillator according to claim 7.

16. A moving object, comprising:
the oscillator according to claim 8.

* * * * *